United States Patent [19]

Teruyama

[11] Patent Number: 5,343,427
[45] Date of Patent: Aug. 30, 1994

[54] DATA TRANSFER DEVICE

[75] Inventor: Tatsuo Teruyama, Kanagawa, Japan

[73] Assignee: Kabushiki Kaisha Toshiba, Kawasaki, Japan

[21] Appl. No.: 976,409

[22] Filed: Nov. 13, 1992

[30] Foreign Application Priority Data

Nov. 14, 1991 [JP] Japan .................. 3-299107

[51] Int. Cl.$^5$ .................................. G11C 8/00
[52] U.S. Cl. ...................... 365/189.04; 365/230.01; 365/230.02; 365/230.03
[58] Field of Search ............ 365/230.01, 230.02, 365/230.03, 193, 189.04

[56] References Cited

U.S. PATENT DOCUMENTS

| | | | |
|---|---|---|---|
| 4,835,684 | 5/1989 | Kanai ............... | 365/230.03 X |
| 4,891,794 | 1/1990 | Hush et al. ......... | 365/189.04 |
| 4,893,279 | 1/1990 | Rahman et al. ...... | 365/189.04 X |
| 5,175,839 | 12/1992 | Ikeda et al. ........ | 365/189.04 X |

FOREIGN PATENT DOCUMENTS 2-307149 12/1990 Japan .

*Primary Examiner*—Do Hyun Yoo
*Attorney, Agent, or Firm*—Foley & Lardner

[57] ABSTRACT

A data transfer device for controlling data transfer among memories includes a first bus control section for transferring addresses to the first memory through a first address bus, and for controlling input and output of a group of first control signals required to access the first memory. Also included is a second bus control section for transferring addresses in the second memory through the second address bus, and for controlling input and output of a group of second control signals required to access the second memory. A control circuit is used for inputting addresses on the first bus, addresses on the second bus, the group of first control signals and the group of second control signals, and selecting one of them based on the control signals from the first bus control section to supply the first memory, and for executing data transfer in one cycle by executing simultaneous address specification to the first bus control section and the second bus control section.

6 Claims, 8 Drawing Sheets

PRINCIPLE OF PRESENT INVENTION

DATA TRANSFER DEVICE

BACKGROUND OF THE INVENTION

1. Field of the Invention

The present invention relates to a data transfer device for controlling data transfer between data storage devices in a data processing system. In particular, the invention relates to a data transfer device with a configuration by which a, CPU or the like can directly access the data storage devices and which can also provide burst transfer, so that data transfer between the data storage devices is possible in one bus cycle with less hardware than used conventionally.

2. Description of the Prior Art

FIG. 1 illustrates a data processing system using a conventional data transfer device. In the drawing, the data processing system includes a data storage device 103-1 and a data storage device 103-2 for storing data to be transmitted, and a data transfer device 101 for controlling data transfer within the system. These structural elements are connected via an address bus ABUS, a data bus DBUS, and a group of control signal lines. This configuration makes it possible to access the data storage devices 103-1 and 103-2. Addresses on the address bus ABUS show addresses in the data storage devices 103-1 and 103-2. The data bus DBUS is used as a data transfer channel. In addition, the control signal group includes a clock signal CLK for transmitting a clock pulse to each structural element, a read-write signal RW indicating the direction of the data transfer, an address strobe signal AS# indicating the validity of an address output on the address bus ABUS, a data strobe signal DS# showing the validity of data output on the data bus DBUS, and an access completed signal DC# for notifying the data transfer device 101 that the transfer of data from the data storage device 103-1 or 103-2 has been completed. Further, as explained below, the # symbol following the symbol name indicates that this signal is a negative logic signal. For example, a direct memory access controller (DMAC), a microprocessor unit (MPU), or the like can function as the data transfer device 101. Also, a RAM, ROM, I/O board or the like can be used as the data storage device 103-1 or the data storage device 103-2. When a RAM is used, for example, there are cases where a large number of memory elements are provided in the interior of the RAM and the various addresses are distributed among these memory elements. The following explanation will treat the data storage devices 103-1 and 103-2 as RAMs, each provided with a large number of memory elements, but the same discussion is possible in the case where one of the data storage devices 103-1 and 103-2 has one address only, as with an I/O port. In a data processing system with this type of configuration, when transmitting data from the data storage device 103-1 to the data storage device 103-2, the data transfer device 101 first reads out data from the data storage device 103-1, then saves this data temporarily in a temporary register 112 in the data transfer device. The data transfer device 101 then writes the data which has been temporarily stored in the temporary register 112 into the data storage device 103-2. This operation is now explained in detail using a timing chart as illustrated in FIG. 2. An address in the data storage device 103-1 is stored in advance in an address register AR1 for a control section 111; an address for the data storage device 103-2 is stored in advance in an address register AR2.

First, the control section 111 in the data transfer device 101 outputs to the address bus ABUS a source address for the data storage device 103-1 which is stored in the address register AR1, and outputs an 'H' level signal showing a read cycle to the read-write signal RW, respectively, for a bus control section 113 to commence data transfer, and, at the same time the address strobe signal AS# is activated (time (a) on the chart). Next, at a time (b), the control section 111 issues an instruction to activate the data strobe signal DS# for the bus control section 113. When the data storage device 103-1 detects that the address strobe signal AS# has been activated, the data storage device 103-1 decodes the source address on the address bus ABUS, recognizes that this address points out a memory element in the data storage device 103-1, and outputs the pertinent data on the data bus DBUS at the time (b) when the data strobe signal DS# is activated. In addition, an access-completed signal DC# is activated in only half a clock period at a time (c), to show that the data transfer has been completed. When the control section 111 in the data transfer device 101 detects that the access-completed signal DC# has been activated, the data on the data bus DBUS is introduced into the internal temporary register 112 at a time (d), the address strobe signal AS# and the data strobe signal DS# are inactivated, and the read cycle is completed. Next, the control section 111 in the data transfer device 101 outputs to the address bus ABUS a destination address which points out a memory element in the data storage device 103-2 stored in the address register AR2, in order to write the data contained in the temporary register 112 into the data storage device 103-2 at the time (d), and outputs an 'L' level signal indicating a write cycle to a read-write signal line RW, respectively, and, at the same time indicates to the bus control section 113 that the address strobe signal AS# has been activated. Further, at a time (e), the control section 111 outputs the data in the temporary register 112 to the data bus DBUS and indicates that the data strobe signal DS# has been activated. When the data storage device 103-2 recognizes from the read-write signal RW that a write cycle has been commenced, the access-completed signal DC# is activated in only half a clock period, at a time (f), and the data on the data bus DBUS is stored at a time (g). When the control section 111 in the data transfer device 101 detects that the access-completed signal DC# has been activated, the completion of the data transfer is recognized, and the write cycle is terminated at a time (g). With this type of conventional data transfer device 101, two bus cycles corresponding to a read cycle and a write cycle are required to transmit data from the data storage device 103-1 to the data storage device 103-2. At the present time, as a result of the remarkable achievements being made in increasing the speed of the central processing, there is a large difference between the operating speed of the CPU and the speed of the data storage device (for example, a DRAM). For this reason, the data transfer time makes up a relatively large proportion of the total processing time. As a result, the increase in the time necessary for transfer causes a reduction in the total processing throughput. There are also physical limits to the improvement of the speed of the external devices themselves, so the present conditions are not very desirable. Accordingly, in data transfer between the CPU and the data storage devices 103-1 and 103-2, and between the data storage device 103-1 and the data storage device 103-2, it is desirable to improve the control method for the data transfer device 101, to reduce the data transfer time. Accordingly, a direct memory access control system has been proposed wherein data is transmitted between memories, for example, between a memory and an I/O memory, within one bus cycle. An explanation of this system is given below, in summary, as a second conventional example of a conventional device, with reference to FIGS.3A, 3B, 4A, and 4B. FIG. 3A is a configuration drawing of a data processing system which uses a direct memory access controller (hereinafter referred to as a DMAC for short), as a second conventional example of a data transfer device.

FIG. 3B is a configuration drawing of the DMAC. In FIG. 3A, the data processing system comprises a main memory 201, a DMAC 202, a plurality of I/O memories 203a, 203b, and 203c, and a processing device 204, such as a microprocessor unit (MPU). The elements 201, 202, 203a, 203b, 203c, and 204 which make up the system are connected in common through a data bus 206 so that data transfer among these devices is possible. A local control signal line 207 connects the main memory 201, the MPU 204, and the DMAC 202. A system control signal line 208 and a system address bus 210 interconnect the DMAC 202, as well as the I/O memories 203a, 203b, and 203c. A local address bus 209 interconnects the main memory 201, the MPU 204, and the DMAC 202. In addition, in the data transfer system of FIG. 3B, the DMAC 202 comprises a DMAC control circuit 214, a first address register 212a, a second address register 212b, a first address renewal circuit 213a, and a second address renewal circuit 213b. The second address register 212b is connected to the local address bus 209, and the first address register 212a is connected to the system address bus 210. For this type of configuration, FIG. 4A is a timing chart for the case where data is transmitted from the main memory 201 to the I/O memory 203a. FIG. 4B is a timing chart for the case where data is transmitted from the I/O memory 203a to the main memory 201. In the case illustrated in FIG. 4A, first, the MPU 204 using the data bus 206 and the local control signal line 207 sets a destination address contained within the I/O memory 203a into a first address register, and sets a source address for the main memory 201 into a second address register 212b, respectively. Also, the data transfer direction and the number of bytes to be transmitted are set in the DMAC control circuit 214, and the DMAC 202 is started. In the DMAC 202, the DMAC control circuit 214 outputs the contents of the first address register 212a as an address signal MAD-P to the local address bus 209, and outputs the contents of the second address register 212b as an address signal AD-P to the system address bus 210. Next, a signal MMEMR-N to provide an address on the local address bus 209 to the data bus 206 is activated in the local control signal line 207.

As a result, the main memory 201 outputs data for an address shown by the second address register 212b, as a signal DT-P for the data bus 206. Data from the main memory 201 awaits output, and the DMAC control circuit 214 activates a signal MEMW-N in the system control signal line 208, which indicates the write-in of a value of the data bus 206 in the address of the I/O memory 203a shown by the system address bus 210. As a result, the operation of writing-in the data transfer destination shown by the system address bus 210 is carried out. After data is written into the I/O memory 203a, the signals MMEMR-N and MEMW-N are inactivated, and control of transfer of a data series is concluded. It is possible to control data transfer within one bus cycle. In addition, in the case of FIG. 4B, it is possible to control data transfer from the I/O memory 203a to the main memory 201 within one bus cycle in the same manner. Also, with the second conventional example of the data transfer device shown in FIGS.3A, 3B, data transfer at highest speed is possible by simultaneously outputting an address to the local address bus 209 and the system address bus 210, but there is the drawback that the total number of address buses is doubled. Accordingly, in order to eliminate this drawback, a configuration is proposed in JPTO-2-307149 which differs from the above-mentioned configuration by having an address latch between the local address bus 209 and the system address bus 210, connected to the local address bus 209, so that the outputs from the first address register 212a and the second address register 212b in the DMAC 202 are switched by a selector, or a configuration wherein an address latch is provided in the I/O memories 203a, 203b, and 203c, connected to the local address bus so that the configuration outputs an address under time-sharing to the local address bus 209 and implements data transfer control within one bus cycle. With this method, the number of address buses is small in comparison with the second conventional example shown in FIGS.3A, 3B and with modifications of the method, and there are advantages over and above the system configuration, but there is the problem that high speed output is impeded for the part of the address which is output under time sharing. In addition, the structure of the second conventional example shown in FIGS.3A, 3B and its modifications is such that data cannot be transmitted between the MPU 204 and the I/O memories 203a, 203b, and 203c, so that it is impossible to have direct access between these devices. Accordingly, in these embodiments of the data transfer device, when data is transmitted between the MPU and an I/O memory this data must be transmitted via the DMAC 202, which adds to the costs. Further, in the first conventional example shown in FIG. 1, the size of the temporary register provided in the data transfer device 101 (DMAC 202) for temporarily storing the transmitted data is limited (normally, about one word, the same width as the data bus DBUS) so that it is impossible to continuously read-out and once again write-in a greater amount of data. For this reason, there is the problem that in transfer or the like in the DRAM, continuous transfer of a plurality of data words using high speed page mode or the like (hereinafter referred to as burst transfer) cannot be performed. Furthermore, nothing is disclosed about a function for burst transfer in connection with the second conventional example and its modifications.

As stated above, with these conventional data transfer devices, there are the drawbacks that:

(1) For data transfer between a pair of data storage devices, two bus cycles—a read cycle and a write cycle—are required;

(2) Even with data transfer devices with a configuration by which data transfer can be controlled within one bus cycle, the total number of address buses is doubled, or high speed output is impeded for the part of the address which is output under time sharing, and, in addition, direct access between the processing device and the data storage device is not possible; and (3) Burst transfer is not possible.

SUMMARY OF THE INVENTION

Accordingly, an object of the present invention is to provide, with due consideration to the drawbacks of such conventional devices, a data transfer device which can transmit data between a pair of data storage devices in one cycle using less hardware than used conventionally, can provide direct access between an MPU and the data transfer device, and can handle burst transfer.

In order to achieve the object, a data transfer device for controlling data transfer among data storage means comprising a first data storage means and a second storage means which are connected through data buses and address buses, and the address bus comprising a first address bus and a second address bus, comprising:

a first bus control means for transferring addresses to the first data storage means through the first address bus, and for controlling input and output of a group of first control signals required to access the first data storage means;

a second bus control means for transferring addresses in the second data storage means through the second address bus, and for controlling input and output of a group of second control signals required to access the second data storage means; and a control means for inputting address on the first data bus, address on the second data bus, the group of first control signals and the group of second control signals, and selecting one of them based on the control signals from the first bus control means to supply the first data storage means, and for executing data transfer in one cycle by executing simultaneous address specification to the first bus control means and the second bus control means.

This invention also provides a data transfer device according to claim 1 wherein:

the first control signal group includes a high speed transfer mode signal for activating data transfer between the first data storage means and second data storage means during the data transfer in one cycle;

the control means selects a first address bus value as an address corresponding to the first data storage device during activation of the high speed transfer mode signal, and when a read-out or write-in operation is specified to the second data storage device, the converse operation is specified with to the first data storage device.

In addition, a data transfer device according to claim 1 wherein:

the first bus control means outputs a burst transfer signal which activates the continuous transfer of a plurality of data words as a package between the first data storage means and the second data storage means;

the first bus control means and the second bus control means provide control during the activation of the burst transfer signal, which continues so that even after the first data transfer to the first data storage means and the second data storage means is completed, the next read-out or write-in of the address is carried out.

Further, a data transfer device according to claim 1, wherein one part of the first address bus and one part of the second address bus are in common.

Furthermore, a data control system comprising:
a data transfer device provided with claim 1;
data storage means for storing data comprising a first data storage means and a second data storage means;
bus means for connecting among the data transfer means, the first data storage means and the second data storage means to transfer the data; and
a CPU for controlling the data transfer between the first data storage means and the second data storage means,
wherein the CPU accesses directly the data transfer between the first data storage means and the second data storage means under the control of the control means.

Moreover, a data control system comprising:
a data transfer device provided with claim 1;
a first data storage means for storing data;
a second data storage means for storing data;
bus means for connecting among the data transfer means, the first data storage means and the second data storage means; and
a CPU for controlling the data transfer between the first data storage means and the second data storage means,
wherein at least the data transfer device and the first data storage means are formed on the same chip.

BRIEF DESCRIPTION OF THE DRAWINGS

These and other objects, features, and advantages of the present invention will become more apparent from the following description of the preferred embodiment taken in conjunction with the accompanying drawings, in which.

DETAILED DESCRIPTION OF THE PREFERRED EMBODIMENTS

Other features of this invention will become apparent in the course of the following description of exemplary embodiments which are given for illustration of the invention and are not intended to be limiting thereof.

The special features of the data transfer device of the present invention will now be explained using an example of data transfer from a first data storage device 3-1 to a second data storage device 3-2.

Figure 5:
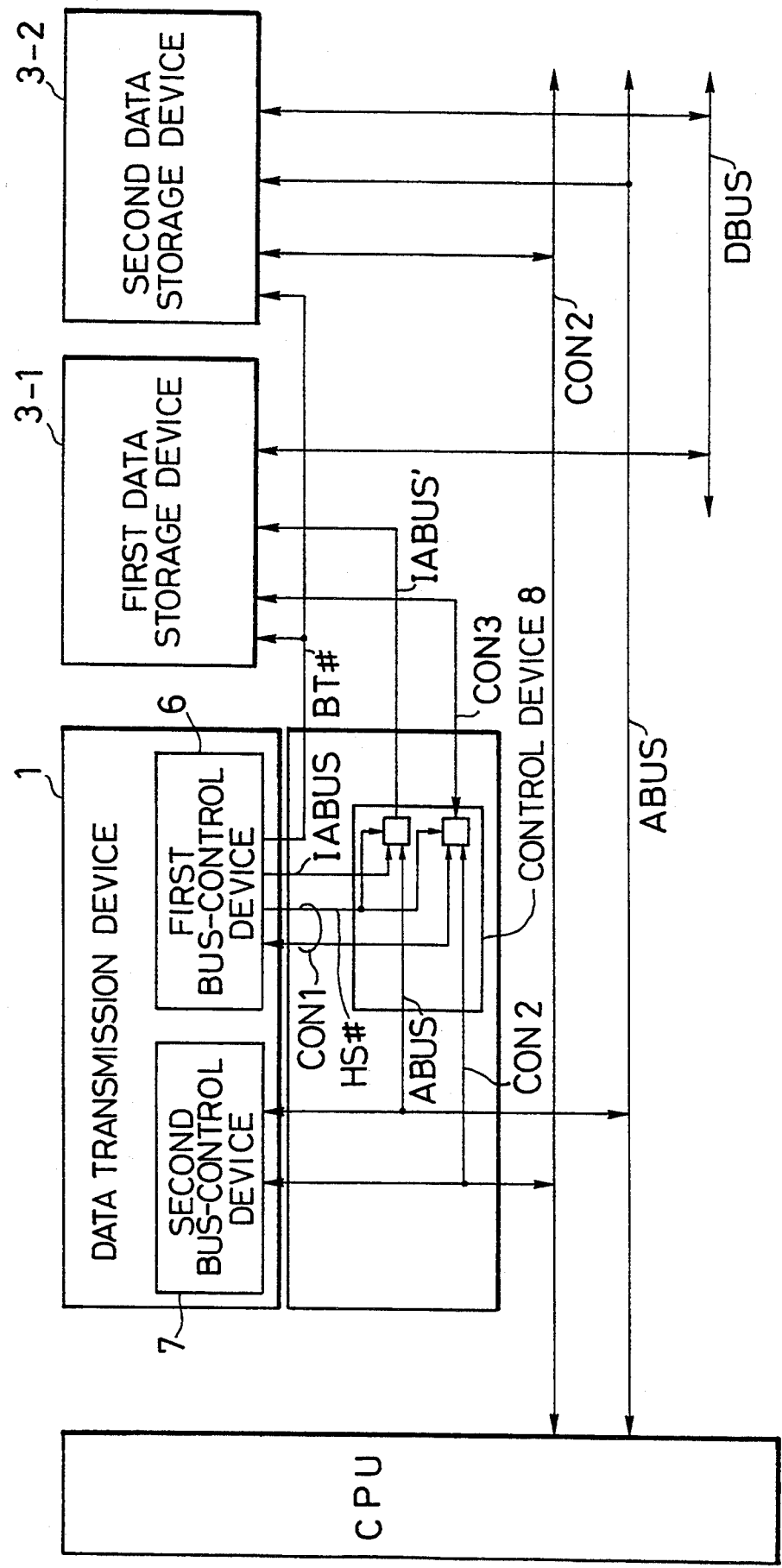
FIG. 5 is a drawing explaining the principle of the present invention.

In a first to third special features of the data transfer device of the present invention, as shown in FIG. 5, a first bus control means 6 outputs a source address to a first address bus IABUS, while simultaneously a second bus control means 7 outputs a destination address to a second address bus ABUS.

In addition, the first bus control means 6 and the second bus control means 7 output signals showing that the address values on the first address bus IABUS and the second address bus ABUS respectively are valid, and the first bus control means 6 shows that a high speed transfer mode signal HS# is activated for a high speed transfer mode. Thereafter, the high speed transfer mode signal HS# remains activated until a high speed transfer cycle is completed, and a control means 8 operates so that the value on the first address bus IABUS is selectively output as an address for the first data storage device 3-1. In addition, the second bus control means 7 outputs a signal reporting a write-in operation to the second data storage device 3-2.

Based on this signal the control means 8 specifies an operation for the first data storage device 3-1 opposite to the read-out or a write-in operation specified for the second data storage device 3-2.

Next, the first bus control means 6 controls so that data is output from the first data storage device 3-1 as the source of the transfer. When a signal is output showing that the data to be read is output from the first data storage device 3-1, the first bus control means 6 notifies this fact to the second bus control means 7. The second bus control means 7 receives this notification and controls so that data is input to the second data storage device 3-2 as the destination. The second data storage device 3-2 outputs a signal indicating the termination of the transfer, and the first and second bus control means inactivate a first second control signal group CON1 (containing the high speed transfer mode signal HS#) and a control signal group CON2, respectively. As a result, it becomes possible to transmit data between the first data storage device 3-1 and the second data storage device 3-2 in one cycle.

In a fourth special feature of the data transfer device of the present invention, a burst transfer signal BT#, activated when a plurality of data words is transmitted continuously between the first and second data storage devices 3-1, 3-2 as a package, is output. When the burst transfer signal BT# is activated, the first and second bus control means 6, 7 control so that even on completion of the first data transfer to the first and second data storage devices 3-1, 3-2, a read-out or write-in operation for the next address is continued. It is therefore possible to handle burst transfer wherein a plurality of data words is transmitted continuously.

Also, in a fifth special feature of the data transfer device of the present invention, by using commonly one part of the first address bus IABUS and the second address bus ABUS, with less hardware than used conventionally, data transfer between the first data storage device 3-1 and the second data storage device 3-2 in one cycle is possible, and, furthermore, it is also possible to handle burst transfer.

Further, in a sixth special feature of the present invention, a data processing system is provided wherein at least the data transfer device 1 and the first data storage device 3-1 are formed on the same chip. An increase in hardware costs from duplication of the address bus and the control signal lines group, and the control means 8, is restrained to a realistic system cost, and it is also possible to strikingly improve the performance.

Figure 6:
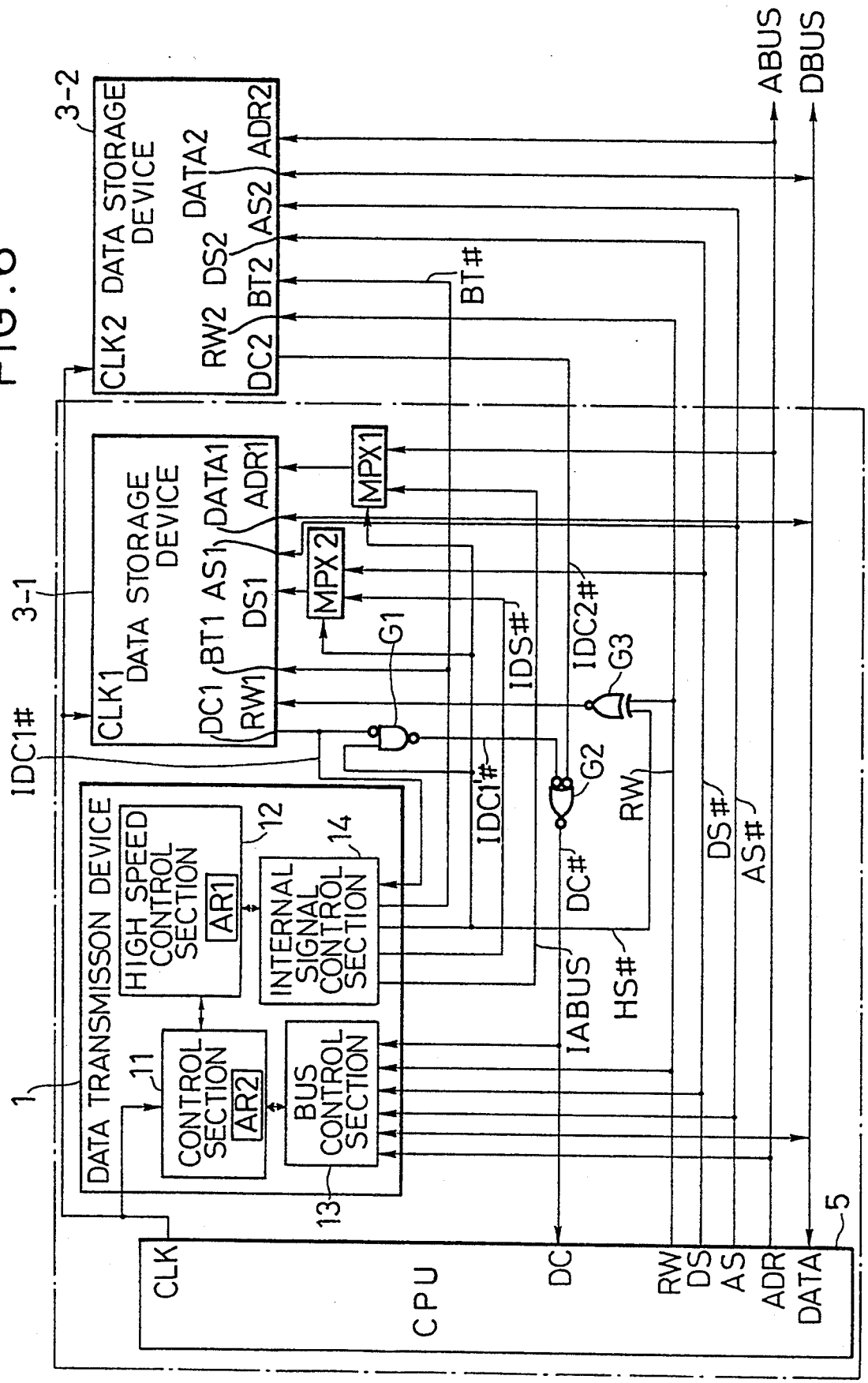
FIG. 6 is a configuration drawing of a data processing system using a first embodiment of a data transfer device of the present invention.

An embodiment of a data transfer device of the present invention will now be explained, based on the drawings. FIG. 6 is a configuration drawing of a data processing system using a first embodiment of a data transfer device of the present invention. In this drawing, parts providing with the same function as parts shown in FIG. 1 have been already described in the prior art section as the conventional example. These parts are designated by the same reference numerals in this embodiment.

The data processing system shown in FIG. 6 comprises a central processing unit (CPU) 5, the data transfer device 1, the data storage devices 3-1, 3-2, a pair of multiplexers MPX1 and MPX2, and a plurality of gate circuits G1 to G3. In addition, the CPU 5, the data transfer device 1, the data storage devices 3-1 and 3-2, the multiplexers MPX1 and MPX2, and the gate circuits G1 to G3 are all formed on the same chip. Further, as one modification of this embodiment of the present invention, the control means 8 of FIG. 5 comprises the multiplexers MPX1 and MPX2 and the gate circuits G1 to G3 and is independent of the data transfer device 1. In addition, the CPU 5, the data transfer device 1, and the data storage devices 3-1, 3-2 are connected via the address bus ABUS, the data bus DBUS, and the control signal lines group. Also, the CPU 5 and the data transfer device 1 are constructed so that access to the data storage devices 3-1, 3-2 is possible. The control signal group is made up of a clock signal CLK, a read-write signal RW, an address strobe signal AS#, a data strobe signal DS#, and an access-completed signal DC#. The CPU 5 performs calculation and transfer of data and sends the transfer requests to the data transfer device 1. The data transfer device 1 controls data transfer between the data storage device 3-1 and the data storage device 3-2 according to a data transfer request from the CPU. In addition, the data storage device 3-1 and the data storage device 3-2 are provided with a plurality of memory elements respectively so that addressing is possible in one-word units, and these devices 3-1 and 3-2 store the data to be transmitted or transmitted data. The data transfer device 1 of this embodiment comprises a control section 11 and a bus control section 13, which perform transfer control in the same manner as in a conventional device, as well as a high speed transfer control section 12 which controls high speed transfer as a special feature of the present invention, and an internal signal control section 14. An address register AR2 which maintains an address for the data storage device 3-2 is provided in the control section 11, and an address register AR1 which maintains an address for the data storage device 3-1 is provided in the high speed control section 12. The bus control section 11 has the same function as in the conventional data transfer device 101, and the address bus ABUS, the data bus DBUS, the address strobe signal line AS#, the data strobe signal line DS#, the access-completed signal line DC#, and the read write signal line RW are connected. In addition, signal lines used exclusively in data transfer to the data storage device 3-1 formed on the same chip is connected to the internal signal control section 14.

In this signal group, there are following signals:
a signal via the internal address bus IABUS which supplies the data storage device 3-1 via the multiplexer MPX1;
an internal data strobe signal IDS# which supplies the data storage device 3-1 via the multiplexer MPX2;

an access-completed signal IDC1'# from the data storage device 3-1;

the high speed transfer mode signal HS# from the internal signal control section 14, which is connected to the exclusive OR gate G3, and which controls the multiplexer MPX1 and MPX2; and the burst transfer signal BT# indicating burst transfer, connected to the data storage device 3-1 and the data storage device 3-2.

The clock signal line CLK, the data bus DBUS, the address strobe signal line AS#, and the burst transfer signal line BT# are directly connected to the data storage device 3-1.

Also, the data on the output of the multiplexer MPX1, which is input to the address bus ABUS and the internal address bus IABUS and selectively output by means of the high speed transfer mode signal HS#, is input to a terminal ADR1. The output of the gate circuit G3, which takes an exclusive OR of the read/write signal RW and the high speed transfer mode signal HS#, is connected to a terminal RW1. The internal access-completed signal line IDC1# from a terminal DC1 is connected to the data transfer device 1 and to the AND gate circuit G1. Further, the AND output IDC1'# is ORed in the gate circuit G2 with an access-completed signal IDC2# from the data storage device 3-2, and supplied to the bus control part 13 of the data transfer device 1 and to the CPU 5. The data strobe signal DS# and the internal data strobe signal IDS# are input to the multiplexer MPX2, and the output of the multiplexer MPX2, which is selectively output by the high speed transfer mode signal HS#, is connected to the terminal DS1. The clock signal line CLK, the address bus ABUS, the data bus DBUS, the read-write signal line RW, the address strobe signal line AS#, the data strobe signal line DS#, and the burst transfer signal line BT# are connected to the data storage device 3-2 and the access-completed signal IDC2# is supplied to the gate circuit G2 from a terminal DC2.

Figure 7:
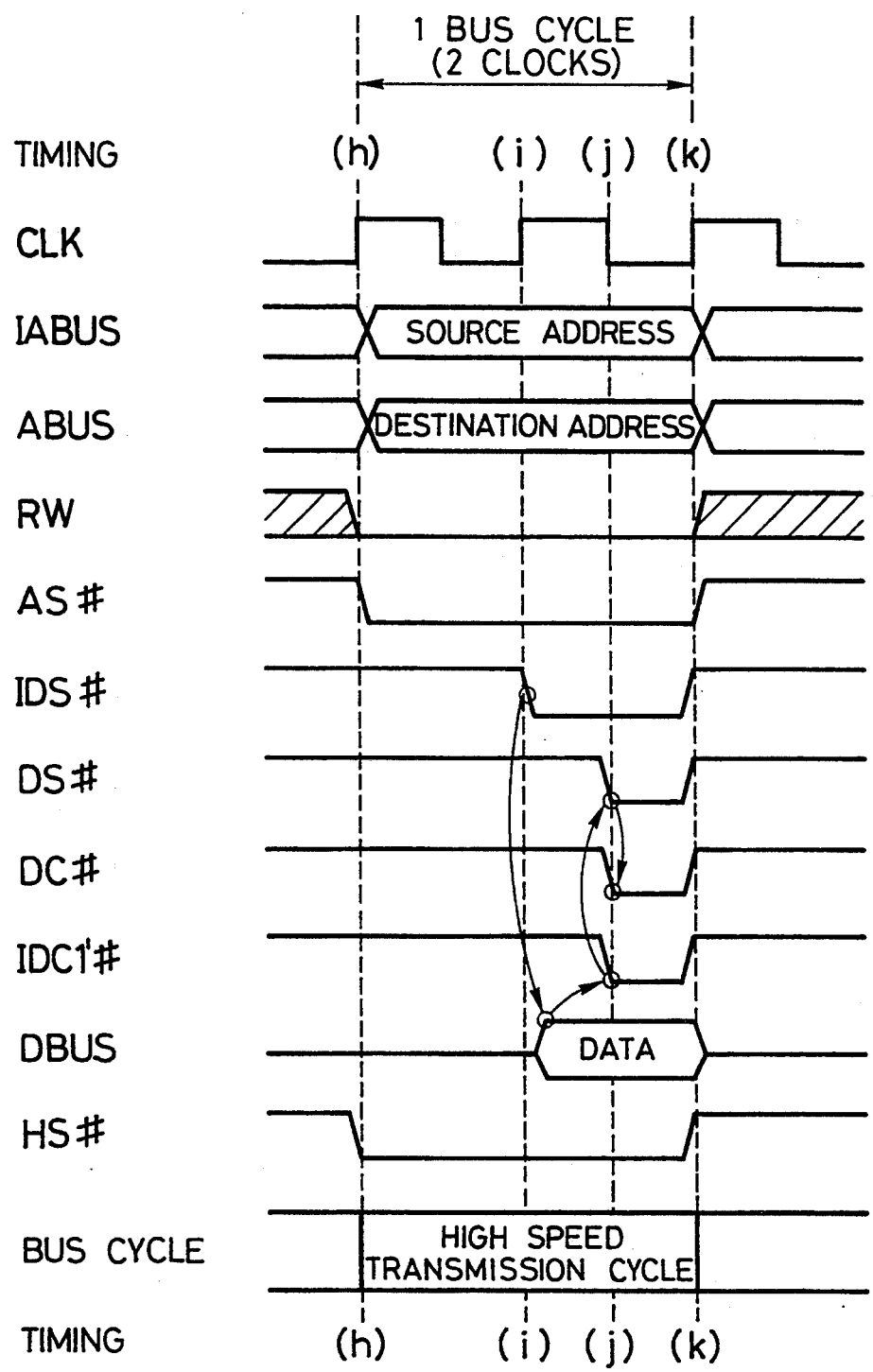
FIG. 7 is a timing chart for explaining the operation of the data transfer device of the present invention.

Next, the operation during which data is transmitted from the data storage device 3-1 to the data storage device 3-2 in the data processing system with this type of configuration, will be explained with reference to FIG. 7 which is a timing chart for the operation of this embodiment.

With this embodiment of the data transfer device 1, the data storage device 3-2 is accessed by the control section 11 and the bus control section 13, and the data storage device 3-1 is accessed by the high speed transfer control section 12 and the internal signal control section 14.

First, a data transfer request is produced from the CPU 5. Thereafter, when the CPU 5 releases the bus, at the time (h) in FIG. 7, the high speed transfer control section 12 indicates to the internal signal control section 14 that the internal signal control section 14 outputs a source address to the data storage device 3-1 through the internal address bus IABUS. Simultaneously, the control section 11 indicates to the bus control section 13 that the bus control section 13 outputs a destination address stored in the address register AR2 to the address bus ABUS.

In addition, the bus control section 13 activates the address strobe signal AS# showing that the address value on the address bus ABUS is valid, and the internal signal control section 14 activates the high speed transfer mode signal HS# indicating high speed transfer mode. Thereafter, until the high speed transfer cycle is terminated, the high speed transfer mode signal HS# is activated (L level), and the multiplexer MPX1 operates to selectively output the internal address bus IABUS, and the multiplexer MPX2 operates to selectively output the internal data strobe signal IDS#. Specifically, the internal address bus IABUS is connected to the terminal ADR1 of the data storage device 3-1, and the internal data strobe signal line IDS# is connected to the terminal DS1. Also, the bus control section 13 reports to the data transfer device 3-2 that a write-in operation is being carried out in the data storage device 3-2, with the read/write signal RW at L level. At this time, the high speed transfer mode signal HS# which is input to the gate circuit G3, and the read-write signal RW are both at L level. As the result, the output of the gate circuit G3 is at H level so that a read-out operation for the data storage device 3-1 is reported. The above operation is done at the time (h). But seen from the data storage device 3-1 it appears to be a normal read cycle, and, seen from the data storage device 3-2, the write cycle is started simultaneously.

Accordingly, in the data storage devices 3-1 and 3-2, the read cycle and the write cycle are carried out in exactly the same manner as conventionally. However, the fact that these cycles are performed simultaneously differs from the conventional method.

Next, at a time (i), the internal signal control section 14 activates the internal data strobe signal IDS# and permits output of data from the data storage device 3-1 as the transfer source. When the terminal DS1 reaches L level through the multiplexer MPX2, the data storage device 3-1 outputs the data at the specified source address to the data bus DBUS. Next, the data storage device 3-1 activates the internal access completed signal line IDC1# at a time (j), indicating output of the data to be read-out. At this time, because the high speed transfer mode signal HS# is at L level, the output signal line IDC1'# from the AND gate circuit G1 remains at H level. When the internal signal control section 14 detects that the internal access-completed signal IDC1# has been activated, it recognizes that the read-out data has been output on the data bus DBUS, and informs the high speed transfer control section 12. The high speed transfer control section 12 receives this notification and indicates the introduction of data to the control section 11. The control section 11 indicates the continuation of the write-in operation to the bus control section 13. The bus control section 13 receives the indication of the continuation of the write-in operation, activates the data strobe signal DS# at the time (j), and informs the data storage device 3-2 that the data value on the data bus DBUS is valid. When the data storage device 3-2 detects that the data strobe signal DS# is activated and recognizes that the data value on the data bus DBUS is valid, the data on the data bus DBUS is introduced at a time (k), and the access-completed signal IDC2#, indicating completion of the transfer, is activated between the times (j) and (k).

As previously explained, during the high speed data transfer mode, because the output of the AND gate circuit G1 is at H level, the OR gate circuit G2 outputs the value of the access-completed signal IDC2# unchanged as the access completed signal DC#. The bus control section 13 in the data transfer device 1, on detecting that the access completed signal DC# is activated, recognizes the 11 completion of the write cycle and informs this to the control section 11. Furthermore, the control section informs the high speed transfer control section 12. When the high speed transfer control section 12 recognizes the completion of both the read cycle and the write cycle, it informs the internal signal control section 14 and also informs the bus control section 13, through the control section 11, of the completion of the high speed transfer cycle. At the time (k), the internal signal control section 14 inactivates the high speed transfer mode signal HS# and the internal data strobe signal IDS#, to terminate the high speed transfer cycle. Also, at the time (k), the bus control section 13 inactivates the address strobe signal AS# and the data strobe signal to terminate the write cycle. The gate circuits G1 to G3 are for normal operation of the usual bus cycle (not in high speed transfer mode) for the data storage device 3-1. During normal mode, the AND gate circuit G1 outputs the value of the access-completed signal IDC1'# unchanged because the high speed transfer mode signal HS# is at H level. The OR gate circuit G2 activates the access completed signal DC# when either the access completed signal IDC1'# or the access completed signal IDC2# is activated. However, because the access completed signal IDC1'# is normally at H level during high speed transfer mode, ultimately the value of the access-completed signal IDC2# is output as the access-completed signal DC#. The gate circuit G3 is used to supply the reverse value of the read-write signal to the terminal RW1 of the data storage device 3-1 during high speed transfer mode, but, at other times the value of the read-write signal RW is supplied to the terminal RW1. In the above explanation of the operation, data transfer from the data storage device 3-1 to the data storage device 3-2 was discussed. However, conversely, data transfer from the data storage device 3-2 to the data storage device 3-1 is basically the same operation. In the data transfer device 1 of this embodiment it is possible to transmit data between the data storage devices 3-1 and 8-2 in one cycle.

Figure 1:
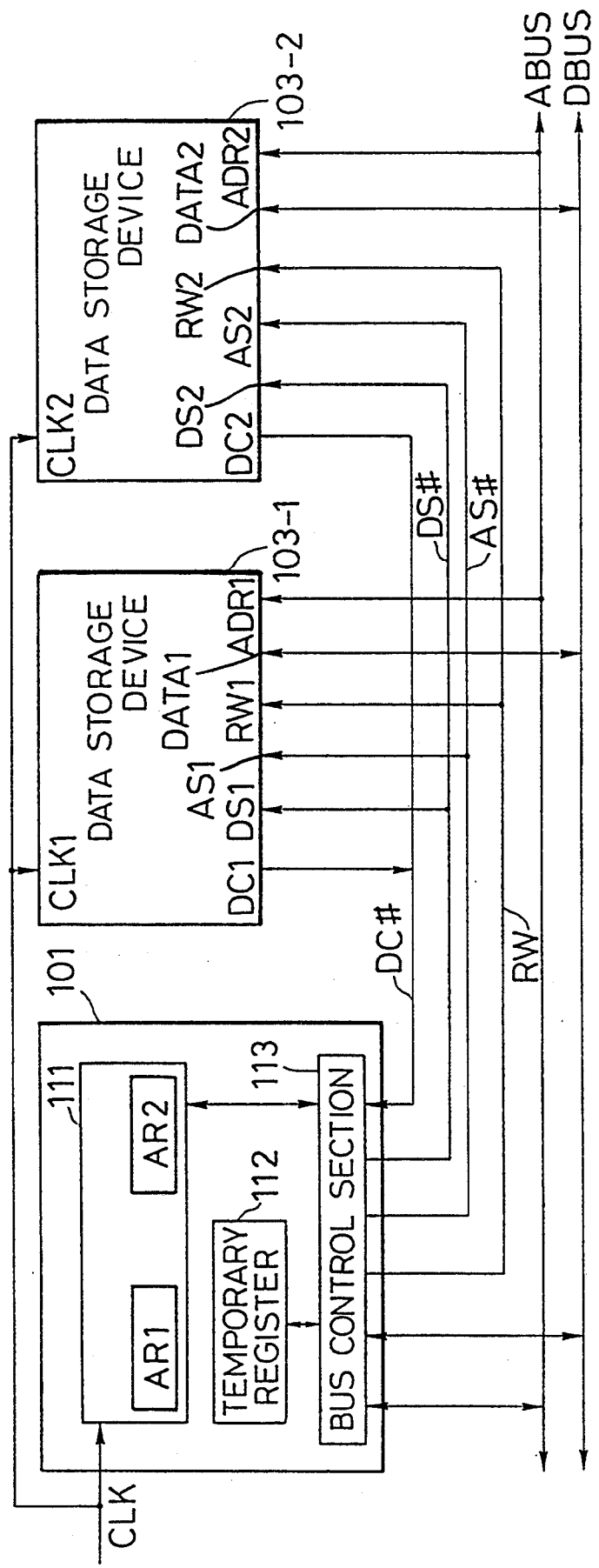
FIG. 1 is a configuration drawing of a data processing system using a conventional data transfer device as the first conventional example.
Figure 2:
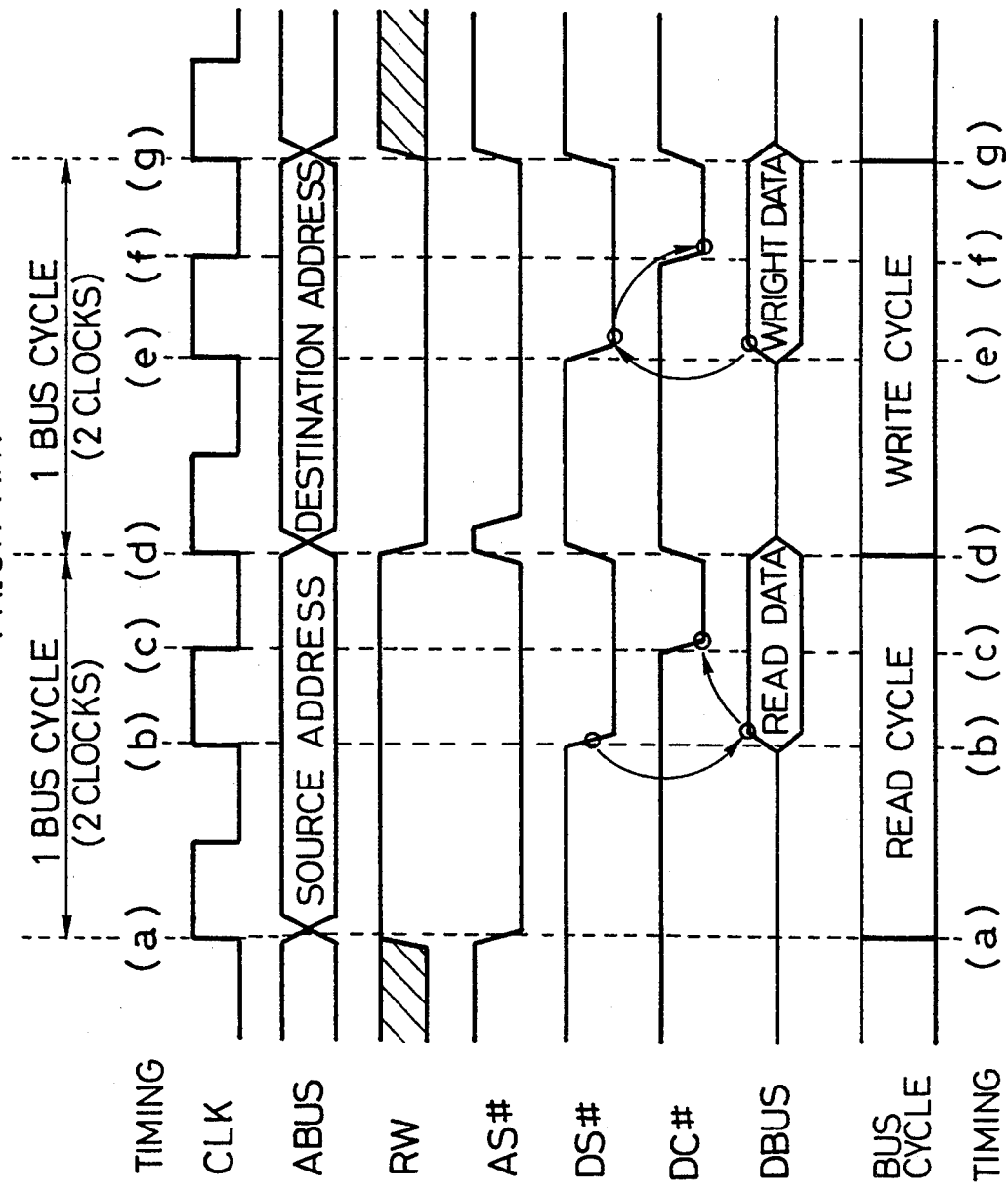
FIG. 2 is a timing chart for explaining the operation of the first conventional example of a data transfer device shown in FIG. 1.
Figure 3A:
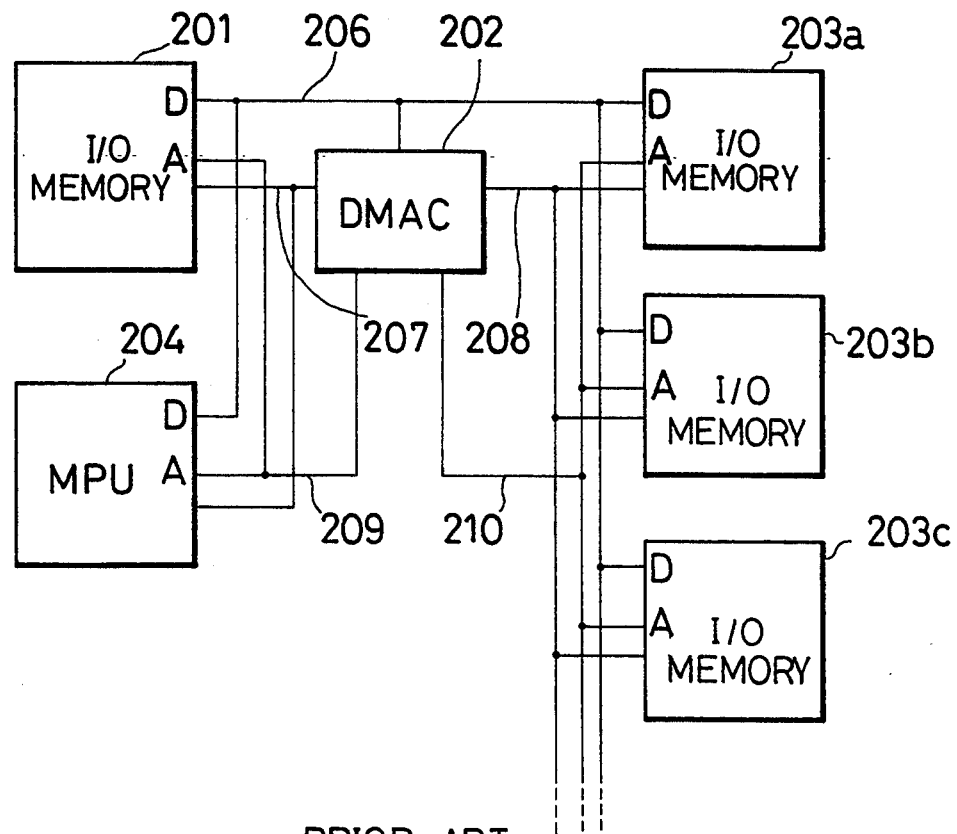
FIG. 3A is a configuration drawing of a data processing system using a conventional DMAC as the second conventional example.
Figure 3B:
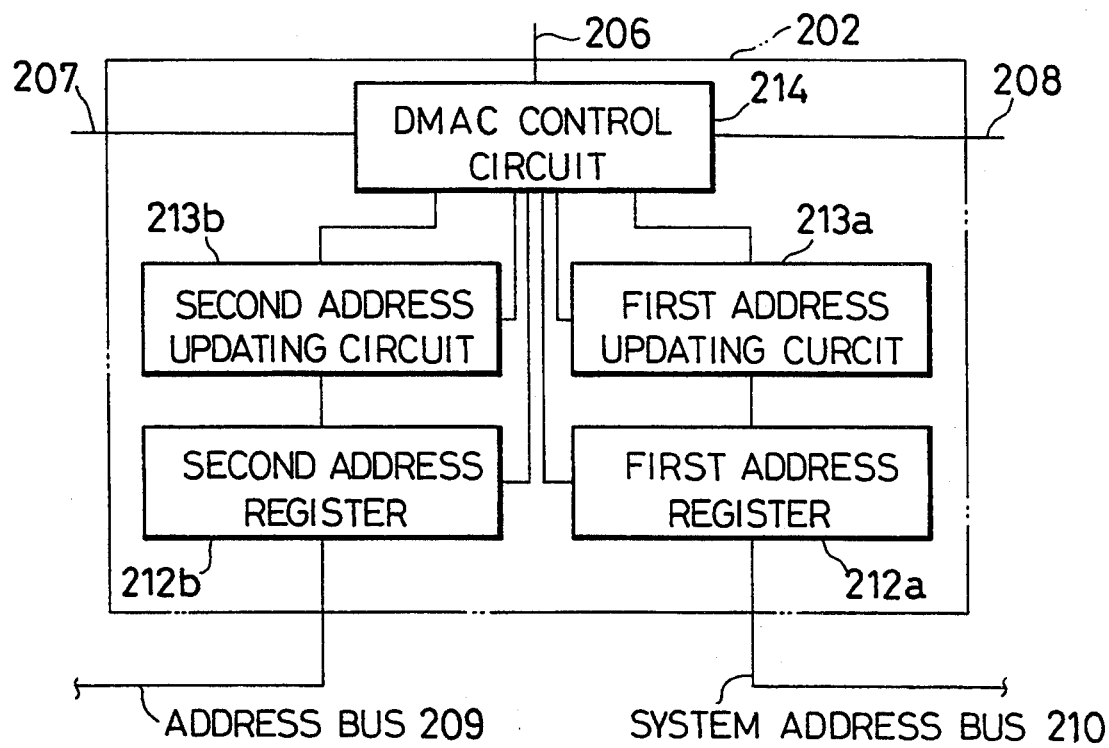
FIG. 3B is a configuration drawing of the DMAC shown in FIG. 3A.

Further, in comparison with the conventional data processing system shown in FIG. 1, it is unnecessary to provide high speed circuitry for the data storage device. In addition, with the high speed transfer mode for the data transfer device 1 of this embodiment, in the case of data transfer between the data storage device 3-1 and the data storage device 3-2, it is unnecessary to temporarily introduce data into the temporary register 112, as with the conventional data processing system shown in FIG. 1, therefore burst transfer using a high speed page mode in a DRAM becomes possible.

The operation during high speed transfer in burst transfer mode will now be explained with reference to the timing chart shown in FIG. 8.

Figure 8:
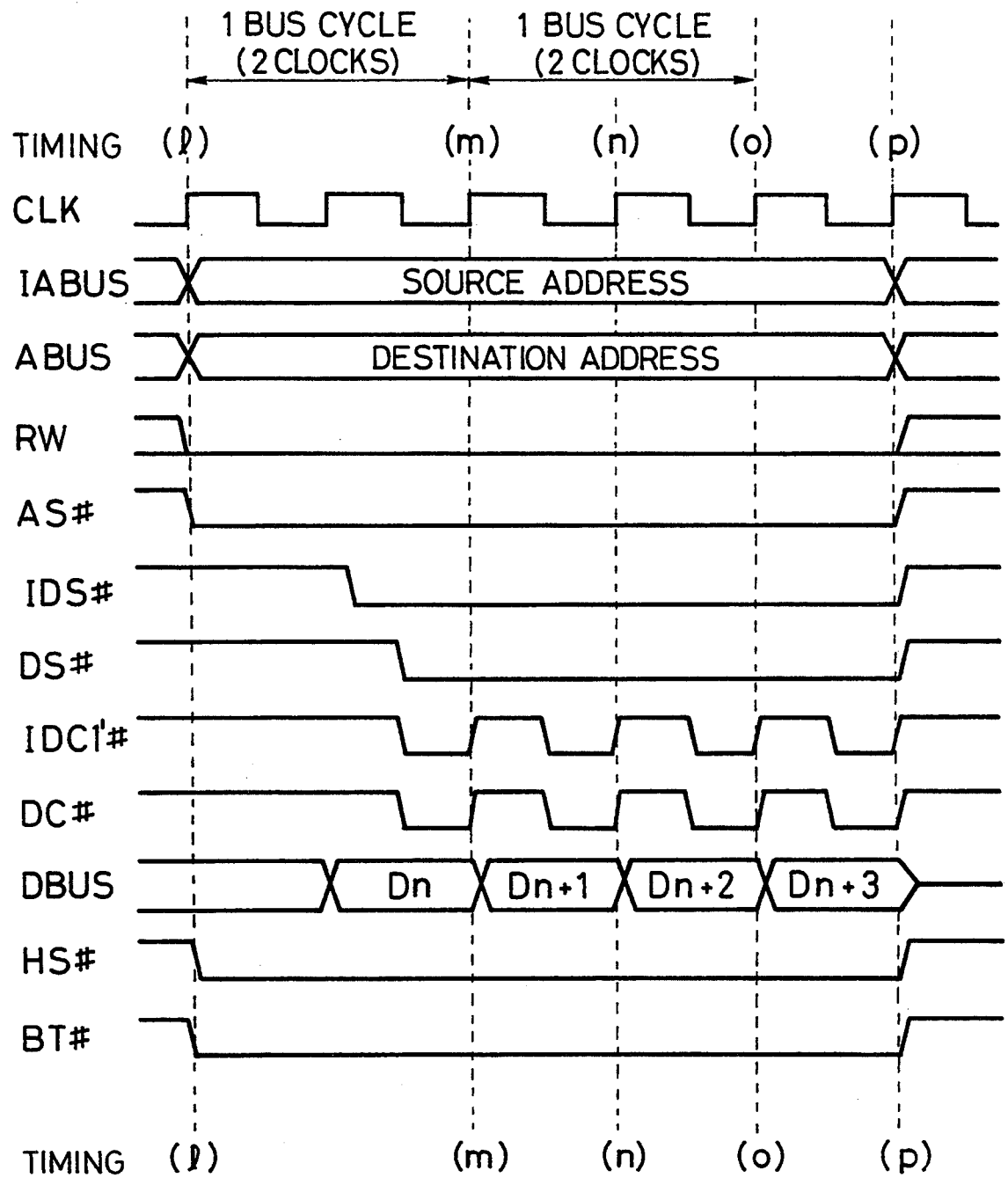
FIG. 8 is a timing chart for explaining a burst transfer operation.

FIG. 8 is a timing chart showing the case where data of four words. Dn to Dn+3 from a source address in the data storage device 3-1 is transmitted to a memory region of four words, beginning from a destination address in the data storage device 3-2. The data transfer device 1 commences the above-mentioned data transfer at a time (1). First, the internal signal control section 14 activates the burst transfer signal BT# at the time (1). Thereafter, the signal BT# remains activated until the burst transfer cycle is terminated (time (p)), and during this interval the data storage devices 3-1 and 3-2 are advised that the burst transfer cycle is active. The operation of performing the transfer of the initial one word of data from the time (1) until the time (m) is the same as that from the time (h) to the time (k) in FIG. 7 except that the BT# is inactivated. Further explanation will therefore be omitted. In addition, the internal data strobe signal IDS# and the data strobe signal DS# remain activated until the time (p) at which the burst transfer cycle is completed. In the same manner, the source address is maintained in the internal address bus IABUS and the destination address is maintained in the address bus ABUS until the time (p), and the read-write signal RW and the address strobe signal AS# also remain activated until the time (p). Next, the operation following the time (m) will be explained. The fact that burst transfer occurs after the burst transfer signal BT# is activated is recognized by the data storage device 3-1, and the next one word of data is output to the data bus DBUS from the time (m). In addition, when the data storage device 3-2 recognizes the burst transfer mode, the next word of data is introduced at the time (n). Thereafter, the data storage device 3-1 successively outputs the succeeding data to the data bus DBUS at the rising edge of each clock signal CLK, and the data storage device 3-2 inputs these data successively as succeeding data. At the time (p), when the final transfer is completed, the data transfer device 1 inactivates the address strobe signal AS#, the internal data strobe signal IDS#, the data strobe signal DS#, the high speed transfer mode signal HS#, and the burst transfer signal BT#, and burst transfer is terminated. As explained in the foregoing, in the high speed transfer mode of this embodiment of the data transfer device 1, in the case where data is transmitted between the data storage device 3-1 and the data storage device 3-2, burst transfer is possible by utilizing the high speed page mode of a DRAM because the operation by which data is temporarily introduced into the data transfer device 1 is unnecessary.

In the case where the present embodiment compares with the conventional data transfer device 101 shown in FIG. 1, when a series of four words is transmitted in the first conventional example in which the source address and the destination address are accessed alternately, burst transfer is conventionally not possible, only normal transfer is repeated, and 4×2×2=16 clock cycles

[(4 words of data) ×
(2 read/write clock cycles) ×
(1 bus cycle = 2 clock cycles)]

are necessary.

Using this embodiment of the data transfer device 1, five clock periods must be executed. In addition, with this embodiment, the configuration of the data processing system is such that the data storage device 3-1, the data transfer device 1, the multiplexers MPX1 and MPX2, and the gate circuits G1 to G3 are formed on the same chip. However, it is possible to obtain the same effect by forming the respective structural units on different chips. With the data processing system using this embodiment of the data processing device 1, however, the number of address buses and control signal lines in the group is doubled in comparison with the conventional device described in the first conventional example shown in FIG. 1. Also, from the aspect of system cost it is not very realistic to form the respective structural elements on different chips, because the multiplexers and gate circuits have been added.

Specifically, it is possible to improve the performance strikingly at a realistic system cost by integrating these elements on the same chip, as in the present embodiment. In particular, as the result of advances in the technology for integrating semiconductor circuitry, it has become possible to provide a built-in RAM, corresponding to the data storage device 3-1 of the present embodiment, on a chip on which the CPU and the data transfer device are integrated, at a realistic cost. Data transfer between the built-in RAM and a RAM on another chip, corresponding to the data storage device 3-2 of the present embodiment, can be carried out in many cases. This embodiment of the data processing device 1 is extremely effective for this type of application. This embodiment can be fabricated using a method of construction in which the bit widths of the address bus IABUS and the address bus ABUS are the same, but the address bus IABUS is formed from the higher order bits only which are a part among all the bits which indicate the address. In this case, the lower order bits other than the part of the higher order bits are provided in common for the data storage device 3-1 and the data storage device 3-2 by the address bus ABUS. In this manner, when one part of the address bus IABUS and the address bus ABUS.are formed in common, it is necessary that the lower order bits of the source address and the destination address be the same. Also, for example, there are, in actual fact, a sufficient number of cases such as the case where the continuous data region in the data storage device 3-2 is copied as a block into the data storage device 3-1, and the bit width of the address bus IABUS, and the bit width of the address register AR1 can be reduced so that the amount of hardware used in the construction can be reduced.

Figure 4A:
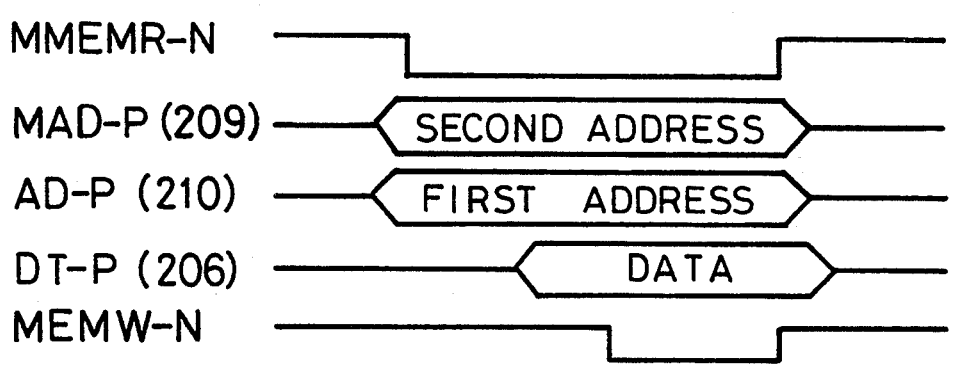
FIG. 4A and FIG. 4B are timing charts for explaining the data transfer operation of the second conventional example.
Figure 4B:
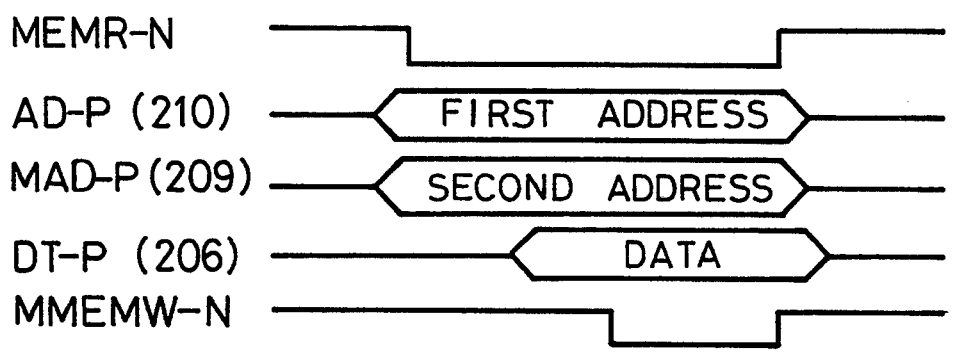

Further, in a configuration in which the CPU 5 is connected to the address bus ABUS, the data bus DBUS, and the control signal line group CON2, such as the configuration of the data processing system using this embodiment of the data processing device 1, in this embodiment, values selected by the multiplexer MPX1 from the address bus IABUS and the address bus ABUS are addresses transferred to the data storage device 3-1. Therefore data transfer between the CPU 5 and the data storage device 3-1 is also possible, and the problem in the second conventional example shown in FIGS.4A, 4B, whereby direct access between the MPU and the I/O memory is not possible, does not occur. As outlined above, by means of the present invention, address specification of the first bus control means and the second bus control means for the first data storage device and the second data storage device is carried out simultaneously so that a data transfer device can be provided in which data can be transmitted between the first data storage device and the second data storage device in one cycle. Also, a burst transfer signal is output from the first bus control means, and when the burst signal is activated, the first and second bus control means control so that even after the first data transfer to the first and second data storage devices is completed, the next address is read out or written in continuously, so that a data transfer device can be provided by which it is possible to provide burst transfer by which data transfer of a plurality of words is carried out in one package continuously. Also, by having one part of the first address bus and second address bus in common, it is possible to provide a configuration with less hardware than conventionally. Further, not only can the increase in hardware costs from duplicating the number of address buses, the number of lines in the control signal line group, and the control means be restrained to provide a realistic system cost by integrating these elements on a single chip, but the performance can also be strikingly improved.

What is claimed is:

1. A data transfer device for controlling data transfer among data storage means comprising a first data storage means and a second data storage means which are connected through data buses and address buses, the address buses including a first address bus and a second address bus, comprising:

first bus control means for transferring addresses to the first data storage means through the first address bus, and for controlling input and output of a group of first control signals required to access the first data storage means;

second bus control means for transferring addresses in the second data storage means through the second address bus, and for controlling input and output of a group of second control signals required to access the second data storage means; and control means for inputting addresses on the first address bus, addresses on the second address bus, the group of first control signals and the group of second control signals, and selecting one of the addresses on the first address bus and the second address bus based on a control signal from the first bus control means to supply the first data storage means, and for executing data transfer in one cycle by simultaneously indicating the address specification in the first bus control means and the second bus control means, wherein the first control signal group includes a high speed transfer mode signal for activating data transfer between the first data storage means and the second data storage means during the data transfer in one cycle;

the control means selects a first address bus value as an address corresponding to the first data storage means during activation of the high speed transfer mode signal; and when a read-out or write-in operation is specified to the second data storage means, a converse operation with respect to the first data storage means is specified.

2. A data transfer device according to claim 1, wherein one part of an address of the first address bus and one part of an address on the second address bus are in common.

3. A data transfer device for controlling data transfer among data storage means comprising a first data storage means and a second data storage means which are connected through data buses and address buses, the address buses including a first address bus and a second address bus, comprising:

first bus control means for transferring addresses to the first data storage means through the first address bus, and for controlling input and output of a group of first control signals required to access the first data storage means;

second bus control means for transferring addresses in the second data storage means through the second address bus, and for controlling input and output of a group of second control signals required to access the second data storage means; and control means for inputting addresses on the first address bus, addresses on the second address bus, the group of first control signals and the group of second control signals, and selecting one of the addresses on the first address bus and the second address bus based on a control signal from the first bus control means to supply the first data storage means, and for executing data transfer in one cycle by simultaneously indicating the address specification in the first bus control means and the second bus control means, wherein the first bus control means outputs a burst transfer signal which activates a continuous transfer of a plurality of data words as a package between the first data storage means and the second data storage means; and the first bus control means and the second bus control means provide control during the activation of the burst transfer signal, which continues so that after the first data transfer to the first data storage means and the second data storage means is completed, the burst transfer for the next address is carried out.

4. A data control system comprising:

data storage means for storing data, the data storage means comprising a first data storage means and a second data storage means;

bus means comprising data buses and address buses, the address buses including a first address bus and a second address bus connected to the data storage means;

data transfer means connected to the bus means for controlling data transfer among the data storage means, the data transfer means comprising:

first bus control means for transferring addresses to the first data storage means through the first address bus, and for controlling input and output of a group of first control signals required to access the first data storage means;

second bus control means for transferring addresses in the second data storage means through the second address bus, and for controlling input and output of a group of second control signals required to access the second data storage means; and control means for inputting addresses on the first address bus, addresses on the second address bus, the group of first control signals and the group of second control signals, and selecting one of the addresses on the first address bus and the second address bus based on a control signal from the first bus control means to supply the first data storage means, and for executing data transfer in one cycle by simultaneously indicating the address specification in the first bus control means and the second bus control means; and central processing unit (CPU) for controlling the data transfer between the first data storage means and the second data storage means through the data buses and for communicating the addresses on the second address bus, wherein the CPU accesses directly the first and second data storage means to transfer the data between the first data storage means and the second data storage means under the control of the control means.

5. A data control system according to claim 4, wherein said control means comprises multiplexer means connected among the first data storage means, the CPU, and the first bus control means for selecting one of addresses from the CPU and the first bus control means.

6. A data control system according to claim 4, wherein at least the data transfer means and the first data storage means are formed on a same chip.

* * * * *